US008271918B2

(12) United States Patent
Kwok et al.

(10) Patent No.: US 8,271,918 B2
(45) Date of Patent: Sep. 18, 2012

(54) FORMAL VERIFICATION OF CLOCK DOMAIN CROSSINGS

(75) Inventors: Ka-Kei Kwok, Milpitas, CA (US); Bing Li, Beijing (CN); Tai An Ly, Austin, TX (US); Rojer Raji Sabbagh, Ontario (CA)

(73) Assignee: Mentor Graphics Corporation, Wilsonville, OR (US)

( * ) Notice: Subject to any disclaimer, the term of this patent is extended or adjusted under 35 U.S.C. 154(b) by 231 days.

(21) Appl. No.: 12/559,343

(22) Filed: Sep. 14, 2009

(65) Prior Publication Data

US 2010/0199244 A1     Aug. 5, 2010

Related U.S. Application Data

(60) Provisional application No. 61/207,883, filed on Jan. 31, 2009.

(51) Int. Cl.
*G06F 17/50* (2006.01)
(52) U.S. Cl. ........ 716/108; 716/113; 716/136; 716/105; 716/125; 703/16
(58) Field of Classification Search ................. 716/108, 716/113, 136, 105, 125; 703/16
See application file for complete search history.

(56) References Cited

U.S. PATENT DOCUMENTS

| | | | | |
|---|---|---|---|---|
| 6,598,191 B1* | 7/2003 | Sharma et al. | ................ | 714/726 |
| 6,615,392 B1* | 9/2003 | Nadeau-Dostie et al. | .... | 716/103 |
| 6,625,797 B1* | 9/2003 | Edwards et al. | ............. | 716/103 |
| 7,039,887 B2* | 5/2006 | Khalil et al. | ................. | 716/108 |
| 7,225,421 B2* | 5/2007 | Migatz et al. | ................ | 716/114 |
| 7,263,675 B2* | 8/2007 | Dargelas | ...................... | 716/136 |
| 7,380,229 B2* | 5/2008 | Byrn et al. | ..................... | 716/102 |
| 7,434,126 B2* | 10/2008 | Wang et al. | ................... | 714/724 |
| 7,779,286 B1* | 8/2010 | Pritchard et al. | ............. | 713/400 |
| 7,823,107 B2* | 10/2010 | Arsovski et al. | ............. | 716/113 |
| 7,853,912 B2* | 12/2010 | Binder et al. | ............... | 716/113 |
| 8,010,926 B2* | 8/2011 | Alpert et al. | ................. | 716/120 |
| 2004/0073876 A1* | 4/2004 | Khalil et al. | ..................... | 716/6 |
| 2004/0225977 A1* | 11/2004 | Akkerman | ........................ | 716/6 |
| 2005/0198601 A1* | 9/2005 | Kuang et al. | ..................... | 716/6 |
| 2005/0240790 A1* | 10/2005 | Nadeau-Dostie et al. | ..... | 713/400 |
| 2005/0251779 A1* | 11/2005 | Chard et al. | .................... | 716/18 |
| 2005/0273735 A1* | 12/2005 | Dargelas | ........................... | 716/4 |

(Continued)

FOREIGN PATENT DOCUMENTS

JP     03177913 A  *  8/1991

*Primary Examiner* — Phallaka Kik

(57) ABSTRACT

Methods and apparatus for performing automated formal clock domain crossing verification on a device are detailed. In various implementations of the invention, a device may be analyzed, wherein the clock domain crossing boundaries are identified. Subsequently, a formal clock domain crossing verification method may be applied to the identified clock domain crossing boundaries, resulting in clock domain crossing assertions being identified. After which the identified assertions may be promoted for post clock domain crossing analysis. With various implementations of the invention, a formal clock domain crossing method is provided, wherein the device components near an identified clock domain crossing are extracted. Assertions may then be synthesized and verified based upon the extracted components. Various implementations of the invention provide for clock domain crossing verification to be performed iteratively, wherein a larger and larger selection of the device is extracted during formal verification. Additionally, various implementations of the present invention provide that the clock domain crossing verification operate on the fly during a device verification procedure. With further implementations, a bit-blasted approach to clock domain crossing verification may be provided during formal verification.

19 Claims, 9 Drawing Sheets

U.S. PATENT DOCUMENTS

| | | | |
|---|---|---|---|
| 2006/0282808 A1* | 12/2006 | Byrn et al. | 716/6 |
| 2007/0283205 A1* | 12/2007 | Chelstrom et al. | 714/727 |
| 2008/0195991 A1* | 8/2008 | Duewer et al. | 716/12 |
| 2008/0313589 A1* | 12/2008 | Maixner et al. | 716/6 |
| 2009/0138837 A1* | 5/2009 | Baumgartner et al. | 716/6 |
| 2009/0193376 A1* | 7/2009 | Alpert et al. | 716/9 |
| 2010/0146468 A1* | 6/2010 | Czeck et al. | 716/6 |

* cited by examiner

FORMAL VERIFICATION OF CLOCK DOMAIN CROSSINGS

RELATED APPLICATIONS

This applications claims priority under 35 U.S.C. §119 to U.S. Provisional Patent Application No. 61/207,883, entitled "Formal Verification Of Clock Domain Crossings," naming Bing Li et al. as inventors, and filed Jan. 31, 2009, which application is incorporated entirely herein by reference.

FIELD OF THE INVENTION

The invention relates to the field of electronic device design and verification. More specifically, various implementations of the invention relate to verification of clock domain crossings.

BACKGROUND OF THE INVENTION

Electronic circuits, such as integrated microcircuits, are used in a variety of products, from automobiles to microwaves to personal computers. Designing and fabricating microcircuit devices typically involves many steps, sometimes referred to as the "design flow." The particular steps of a design flow often are dependent upon the type of microcircuit, its complexity, the design team, and the microcircuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design. These various microcircuits are often referred to as integrated circuits (IC's).

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, often mathematically, to confirm that the circuit described by the device design will correctly perform the desired functions. This analysis is sometimes referred to as "formal verification." Additionally, timing verifications are often made at this stage, by for example simulating the various clocks employed to drive the device.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing circuit device components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

As indicated, device verification often takes place prior to the actual manufacturing of the device. As a result, hardware description languages are typically employed to model the hardware and act as an embodiment for testing purposes. However, testing and verification of physical devices also occurs after manufacturing. For purposes of brevity and clarity, a distinction between verification at the design level and at the physical level is not always made in the balance of this disclosure. Furthermore, the term device may be used interchangeably to refer to a physical embodiment of the device as well as to models or representations of the device.

Clock Domain Crossing Verification

As stated, verification of the timing of a device often takes place during device development. The speed with which components in a circuit process signals is dictated or "driven" by a clock. Modern circuits may have multiple clocks. For example, a modern microprocessor may have a clock that allows for performance at maximum speed as well as a second clock that allows the device to perform at a reduced speed. Due to the flexibility of modern designs, multiple clocks are often required. The number of clocks in a given design is further increased by the fact that modern circuits are decreasing in size exponentially, which has allowed designers to add an increased number of circuit components into a design of a given size. This is especially true in the realm of System-on-Chip (SOC) devices.

A System-on-Chip is a microcircuit device that contains blocks or "systems" for performing various tasks, packaged as a single device. System-on-Chip devices are prevalent in modern electronics, such as cell-phones, digital video disk (DVD) players, video game consoles, household appliances, automobiles, and telecommunications equipment. Typically, a System-on-Chip is composed of blocks specifically designed to perform a particular task. These blocks are all interconnected by some communication structure, such as a shared communication bus or even a Network-on-Chip (NoC).

The components or blocks of a circuit are driven by a particular clock or a particular clock frequency. A clock having a particular frequency or speed is often referred to as a clock domain. More particularly, a clock domain is a circuit component or group of components driven by a clock or even a group of clocks that have a fixed phase relationship to each other. Clocks that are asynchronous to each other belong to different clock domains. Similarly, components driven by asynchronous clocks are said to belong to different clock domains.

Electronic signals may originate from one clock domains and be conveyed or transferred to a different clock domain, by for example signal sampling. A signal that originates in a different clock domain than it is received is said to be a clock domain crossing (CDC) signal. Designs where multiple clock domain crossings occur have historically been difficult for designers to verify. Compounding this verification problem is the fact that modern devices, such as system on chips, may contain dozens of clock domains and approximately $10^4$ clock domain crossing signals.

One of the problems associated with clock domain crossings is metastability. Metastability is discussed in an article by C. Cumming entitled "Synthesis and Scripting Techniques for Designing Multi-Asynchronous Clock Designs," published by Synopsis Users Group (SNUG) in 2001, which article is incorporated entirely herein by reference. Metastability occurs when, for example, the data stored within a memory storage register changes during either the setup time or the hold time of the register.

Historically, metastability was countered by adding synchronizers at the clock domain crossing boundaries. For example, two back-to-back flip-flops may be employed as synchronizers. This synchronizer scheme, however, does not prevent random delay from being introduced into the receiving clock domain. Some other common approaches to resolving clock domain crossings are to employ a first in first out (FIFO) data abstraction scheme or to employ a handshaking scheme.

Various other schemes for resolving and verifying clock domain crossings are discussed in "A Methodology for Verifying Sequential Reconvergence of Clock-Domain Crossing Signals," by T. Ly et al., *Design and Verification Conference*, 2005, "Symbolic Model Checking Without BDDs," by A. Biere et al., *Fifth International Conference on Tools and Algorithms for Construction and Analysis of Systems (TACAS'99)*, pp. 193-207, March 1999, "Symbolic Model Checking," by K. L. McMillan, Kluwer Academic Publishers, Boston Mass., 1994, "Computer-Aided Verification of Coordinating Processes," by R. P. Kurshan, Princeton University Press, Princeton N.J., 1994, "Clock Domain Crossing-Closing the Loop on Clock Domain Function Implementation Problems," *Cadence Design Systems*, 2004, "The Need for an Automated Clock domain crossing verification Solution," by N. Hand, Mentor Graphics Corporation, 2006, "Critical Clock-Domain-Crossing Bugs," by S. Sarwary et al., *Electronics Design Strategy News*, Apr. 3, 2008, "Formal Verification of Synchronizers," by T. Kapschitz et al., *Conference of Correct Hardware Design and Verification Methods*, 2005, "Using Assertion-Based Verification to Verify Clock Domain Crossing Signals," by C. Kwok et al., *Design and Verification Conference*, 2003, and "Verifying Synchronization in Multi-Clock Domain SoC," by T. Kapschtiz et al., *Design and Verification Conference*, 2004, which articles are all incorporated entirely herein by reference.

The above methods for dealing with clock domain crossings fail to provide a complete framework for resolving and verifying clock domain crossings. For example, the above clock domain crossing verification methods lack procedures for on the fly analysis and procedures for structural analysis. An additional limitation with conventional formal verification methods is due to their limited capacity. As a result, most conventional formal verification methods operate on the block level of verification. This is significantly different from the other functional verification methods, which execute over the entire circuit.

An additional limitation with conventional formal verification methods is that the methods do not operate automatically. That is to say that a user must manually configure the design and feed any verification assertions generated from the various clock domain crossing tools into any necessary simulation or formal verification tools. This drawback is extremely inconvenient and adds significantly to the time required for verification.

Further limitation with conventional formal verification methods result from their performing verification after the signal has crossed the clock domain. For example, some methods collect all the checks and assertions during a clock domain crossing analysis, and then synthesize them together with the design to form a formal netlist, and finally perform formal verification on the synthesized netlist. This approach is not ideal, however, as most clock domain crossing protocols are not local and require a flattened synthesized design. More particularly, the checks ensure that data and control signals are correctly conveyed across clock domain crossings. Although formal techniques, such as abstraction refinement, are efficient techniques to verify local properties like clock domain crossings, they must operate on bit-level or word-level netlists. As a result of this restriction, memory consumption issues may prevent a clock domain crossing verification from being performed on a particular device.

SUMMARY OF THE INVENTION

The invention provides methods and apparatus for performing automated formal clock domain crossing verification on a device. In various implementations of the invention, a device may be analyzed, wherein the clock domain crossing boundaries are identified. Subsequently, a formal clock domain crossing verification method may be applied to the identified clock domain crossing boundaries, resulting in clock domain crossing assertions being identified. After which the identified assertions may be promoted for post clock domain crossing analysis. With various implementations of the invention, a formal clock domain crossing method is provided, wherein the device components near an identified clock domain crossing are extracted. Assertions may then be synthesized and verified based upon the extracted components.

Various implementations of the invention provide for clock domain crossing verification to be performed iteratively, wherein a larger and larger selection of the device is extracted during formal verification. Additionally, various implementations of the present invention provide that the clock domain crossing verification operate on the fly during a device verification procedure. With further implementations, a bit-blasted approach to clock domain crossing verification may be provided during formal verification.

BRIEF DESCRIPTION OF THE DRAWINGS

The present invention will be described by way of illustrative embodiments shown in the accompanying drawings in which like references denote similar elements, and in which.

DETAILED DESCRIPTION OF ILLUSTRATIVE EMBODIMENTS

The disclosed technology includes all novel and unobvious features, aspects, and embodiments of the systems and methods described herein, both alone and in various combinations and sub-combinations thereof. The disclosed features, aspects, and embodiments can be used alone or in various novel and unobvious combinations and sub-combinations with one another.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "determine" to describe the disclosed methods. Such terms are high-level abstractions of the actual operations that are performed. The actual operations that correspond to these terms will vary depending on the particular implementation and are readily discernible by one of ordinary skill in the art.

Some of the methods described herein can be implemented by software stored on a computer readable storage medium, or executed on a computer. Additionally, some of the disclosed methods may be implemented as part of a computer implemented electronic design automation (EDA) tool. The selected methods could be executed on a single computer or a computer networked with another computer or computers. For clarity, only those aspects of the software germane to these disclosed methods are described; product details well known in the art are omitted.

Illustrative Computing Environment

Figure 1:
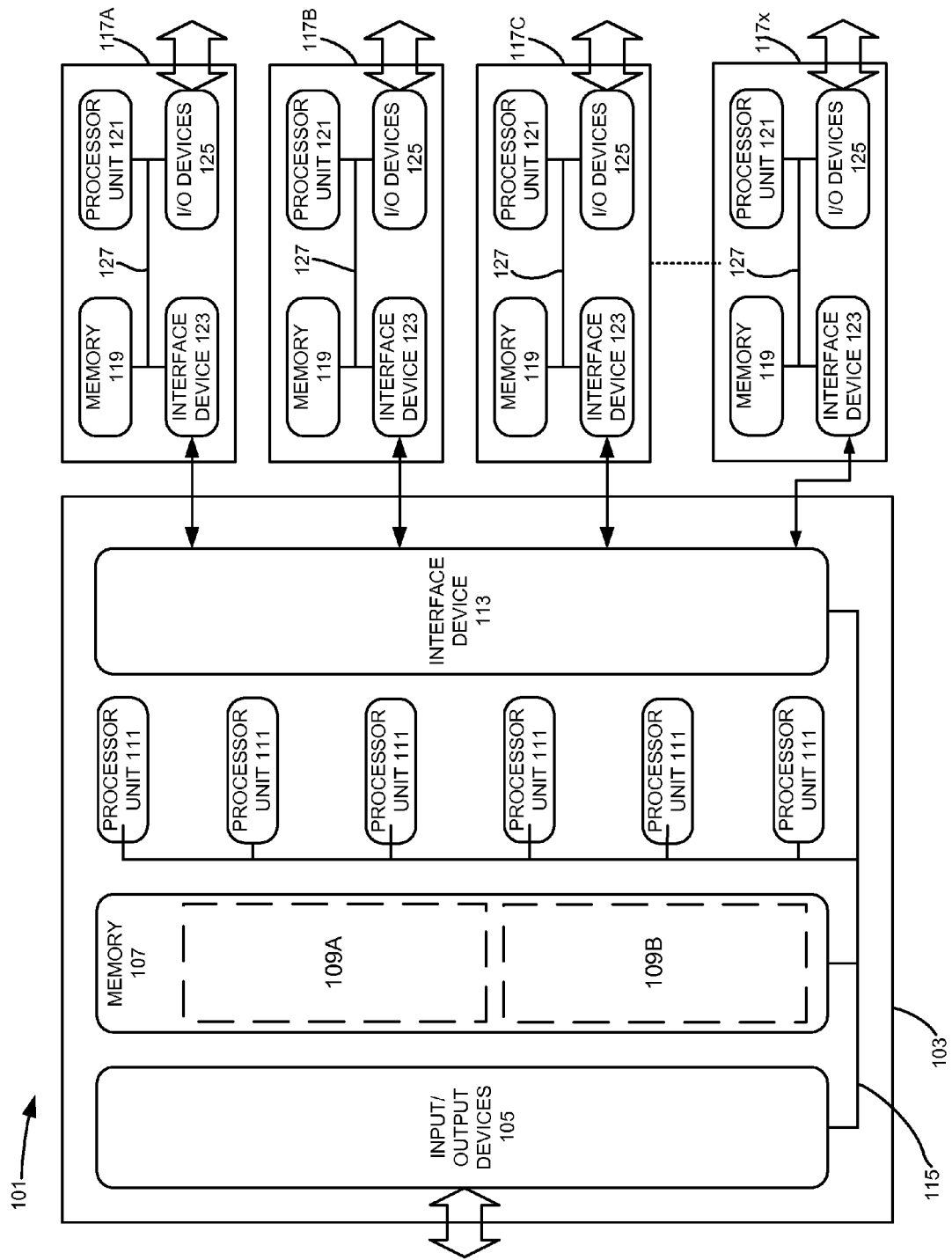
FIG. 1 illustrates an illustrative computing environment.

Various examples of the invention may be implemented through the execution of software instructions by a computing device, such as a programmable computer. Accordingly, FIG. 1 shows an illustrative example of a computing device 101. As seen in FIG. 1, the computing device 101 includes a computing unit 103. The computing unit 103 having a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a magnetic disk drives 115, a solid state disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

Figure 2:
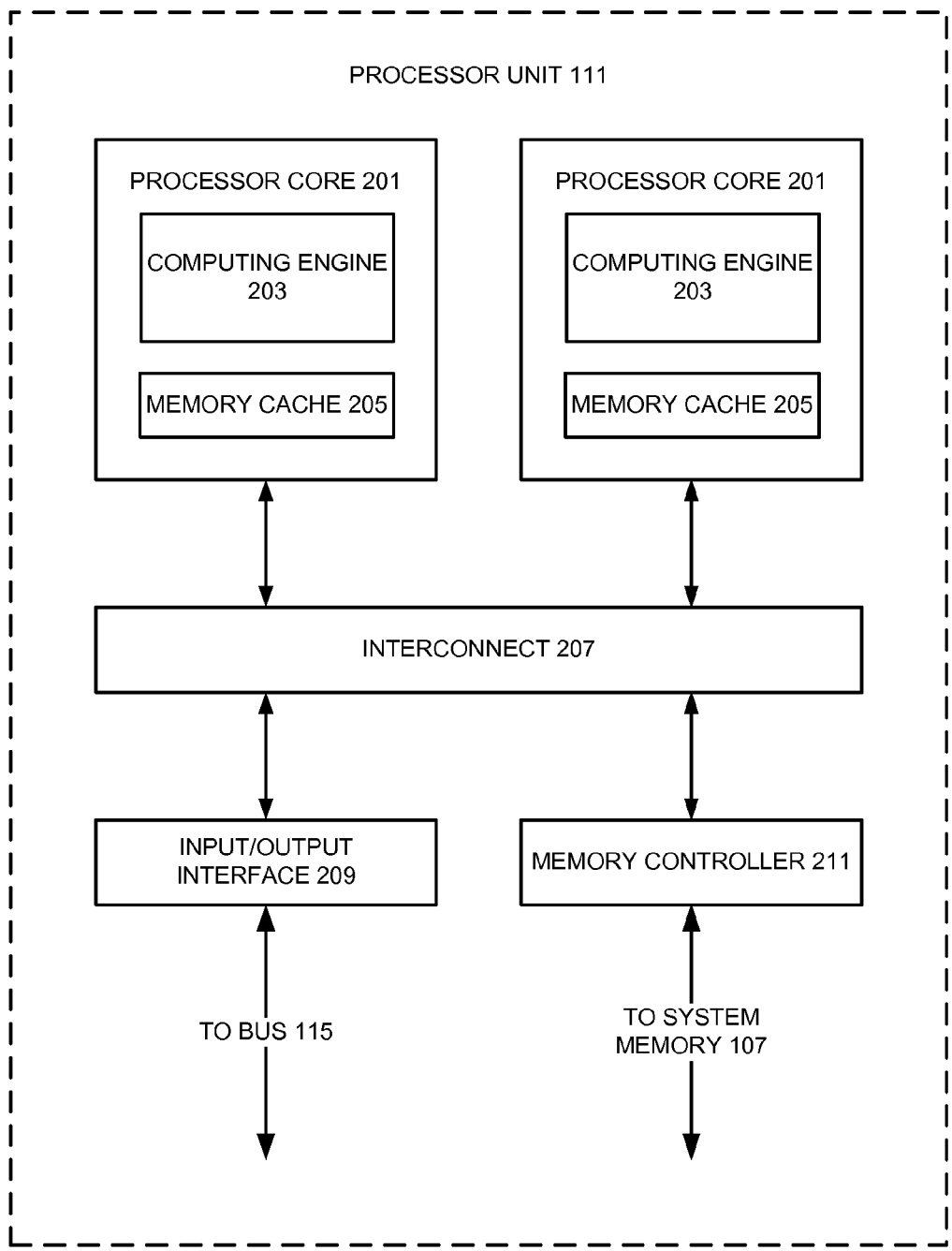
FIG. 2 illustrates a portion of the illustrative computing environment of FIG. 1, shown in further detail.

With various implementations of the invention, the processor unit 105 is a multi-core processor unit, such as the multi-core processor unit 105 illustrated in FIG. 2. As can be seen in FIG. 2, the processor unit 105 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor units 201, such as the Cell Broadband Engine™ (Cell) microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interfaces 209 and a memory controller 211. The input/output interface 209 provides a communication interface between the processor unit 201 and the bus 113. Similarly, the memory controller 211 controls the exchange of information between the processor unit 201 and the system memory 107. With some implementations of the invention, the processor units 201 may include additional components, such as a high-level cache memory accessible shared by the processor cores 201.

It should be appreciated that the computer 101 is illustrated in FIG. 1 and the processor unit 105 illustrated in FIG. 2 are shown as examples only. They are not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Clock Domain Crossing Protocols

As stated above, during formal verification, a device is often represented by a model. In various implementations of the invention, a mathematical model is employed to represent the device. With various implementations of the invention, a model describing the connectivity of the device, such as for example a netlist, is employed. Those of skill in the art will appreciate that the models, even mathematical models represent real world device designs and real world physical devices. Accordingly, manipulation of the model, even manipulation of the model when stored on a computer readable medium, constitutes a transformation corresponding to a tangible device. Additionally, those of skill in the art can appreciate that during a verification process, the devices response to various signals or inputs is determined Manipulation of these signals or inputs and the devices response further constitute a transformation of tangible material.

These models are utilized in device verification to exhaustively verify the device, by for example, exploring the state space of the model. In order to exhaustively verify a device that includes clock domain crossings, the various clock domain crossing protocols must be understood. Accordingly, a few clock domain crossing protocols and associated verification schemes are discussed below. This list is not intended to include all types of clock domain crossing protocols. Neither is this list intended to be limiting. Instead, the list is provided as a courtesy to the reader and for purposes of illustrating the various implementations of the invention.

Gray Code

One clock domain crossing protocol is the gray code. Gray coding seeks to reduce changes on the signals at the clock domain crossing due to factors such as metastability. As discussed above, as a result of metastability, clock domain crossing signals are not guaranteed to be correctly received. This is true even where synchronizers are used between the clock domains. Gray coding restrict the changes of the signal at the clock domain crossing by encoding the data bus with a "gray-code." With various implementations, the gray code methodology forces the clock domain crossing signals to change at most one bit per clock cycle. As a result, an increase in the stability of transmitted signals is achieved.

In general, gray coding is implemented such that for a signal having multiple bits, only one of the bits is permitted to change at any given time. Accordingly, if factors such as metastability do occur, the value of the particular changed bit will be either the prior value before the change or the new value. As a result, the value received at the receiving side of the system will always be valid. This is particularly useful for signals conveying a state machine address for example.

In various implementations of the invention, a gray coding protocol may be formally verified by ensuring that at most one bit changes for each transmitted clock cycle. For example, letting Tx1 and Tx2 equal the values transmitted by a signal for any two consecutive clock cycles, a gray code protocol may be verified by ensuring that the following statement is always true, where 1'b1 is a single bit binary signal having a value of '1'.

$$!(|(Tx1 \wedge Tx2) \& \sim((\sim Tx1 \wedge Tx2)+1'b1))) == \text{True} \quad (1)$$

Signal Stability

As further discussed above, synchronizers are often placed at the boundaries of a clock domain crossing to help reduce the effects of metastability. However, a signal, after passing through a clock domain crossing synchronizer may settle at a different value. As a result signal transfer between the two clock domains may still suffer from metastability. In order to guarantee that the receiving clock domain samples the correct value, the transmitting signal must remain stable enough for the receiving clock to sample the signal. Prior to discussing a signal stability verification method, it may help to further define signal stability. Let S equal a clock domain crossing signal, let $P_{tx}$ equal the period of the transmitting clock, and let $P_{rx}$ equal the period of the receiving clock. Accordingly, the number of stable cycles N with which a receiving clock domain may sample the signal S may be defined by the following as follows.

$$N = \left\lfloor \frac{P_{rx}}{P_{tx}} \right\rfloor + 1 \quad (2)$$

If S signal remains stable at least N clock cycles for each new value, it is often referred to as an N-cycle-stable signal. Alternatively stated, S is an "N-cycle-stable" signal if for any N consecutive cycles, S changes only once.

In various implementations of the invention, a clock domain crossing signal S is verified for stability, by ensuring that the following statement is satisfied.

$$\left( \bigwedge_{i=0}^{N-1} S_i = S_{i+1} \right) \vee \left\{ \bigvee_{i=0}^{N-1} \left[ (S_i \neq S_{i+1}) \wedge \bigwedge_{j=0, j \neq i}^{N-1} (S_j = S_{j+1}) \right] \right\} \quad (3)$$

As can be seen from Equation (3), a signal S may be verified for stability by looking at the value of the signal S for each cycle N. Equation (3) is satisfied if the signal S does not change during the N cycles. For example, for all time i from 0 to (N−1) if the signal S at time i ($S_i$) equals the signal S at time i+1 ($S_{i+1}$), the statement is satisfied. Alternatively, Equation (3) is satisfied if the signal S changes only once during the N cycles. For example, for any time i in 0 to (N−1), and all other time j in 0 to N−1 (where j not equal to i) if the signal S at time i ($S_i$) does not equal the signal S at time i+1 ($S_{i+1}$), but the signal S at time j ($S_j$) does equal the signal S at time j+1 ($S_{j+1}$), the statement is still satisfied.

As those of skill in the art can appreciate, the complexity of Equation (3) is O($N^2$) with respect to the values of the clock domain crossing signals at different time frames. As a result, it is often computationally burdensome to verify signal stability with Equation (3). Accordingly, with various implementations of the invention, signal stability may be verified by ensuring that the following statement is satisfied.

$$(S_0 \neq S_1) \rightarrow \bigwedge_{i=1}^{N-1} (S_i = S_{i+1}) \quad (4)$$

As those of skill in the art can appreciate, Equation (4) is a modified form of Equation (3) discussed above that still satisfies the definition of an N-cycle-stable signal. However, the complexity of Equation (4) is O(N) with respect to the values of the clock domain crossings signals at different time frames, which is exponentially simpler than Equation (3). The difference between Equation (4) and Equation (3) is that the for Equation (4), the value of S changes at the beginning, i.e. i=1, of the N consecutive clock cycles as opposed to at anytime i. This is further explained by reference to FIG. 3.

Figure 3:
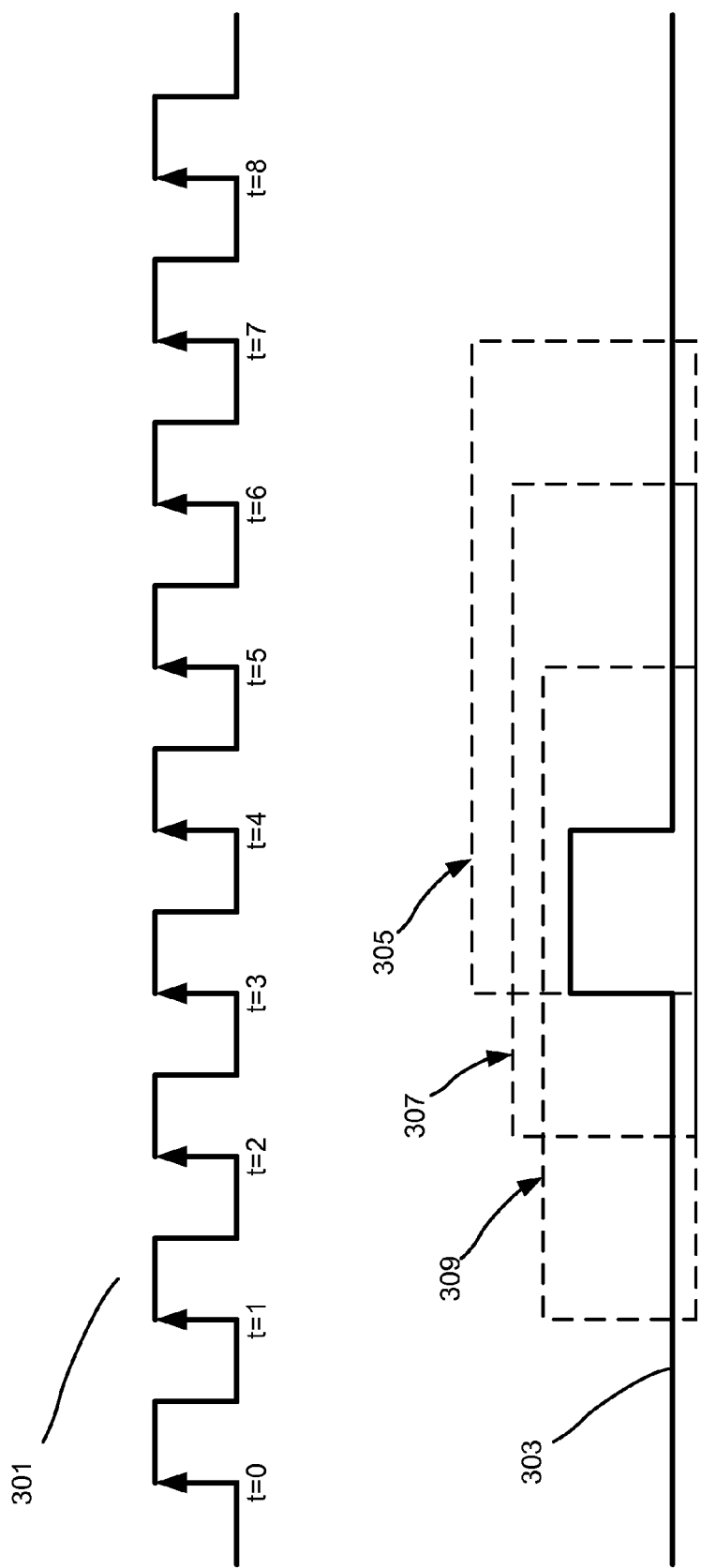
FIG. 3 illustrates a clock, data signal, and errors indicating potential instability of the data signal.

FIG. 3 illustrates a clock signal 301, a clock domain crossing signal 303, and errors windows 305 through 309. The errors windows highlight portions of the clock domain crossing signal 303 that change more than once in N consecutive cycles. As can be seen from this figure, the clock signal 301 has nine (9) cycles 0 through 8. As can be further seen, the clock domain crossing signal 303 changes from having a value of logic "0" to having a value of logic "1" at time t=3 and back to having a value of logic "0" at time t=4.

As described above, the signal stability of the clock domain crossing signal 303 may be verified by utilization of either Equation (3) or Equation (4). As stated above, formal verification employs mathematical formula to prove or disprove a particular property. Equation (3) is designed to generate multiple examples that may be used to prove or disprove a property, while Equation (4) is designed to generate only one. However, as illustrated in FIG. 3, both Equation (3) and Equation (4) detect the error window 305. As a result, both Equation (3) and Equation (4) prove that the clock domain crossing signal 303 violates the stability check. Although Equation (3) also detects the error windows 307 and 309, and as a result appears more robust, this robustness comes at an increased computational cost.

Reconvergence

Reconvergence occurs where multiple signals are transferred across a clock domain and combined by a logic function. As discussed above, random delay may be introduced into clock domain crossing signals by synchronizers. This random delay combined with reconvergence may cause relationships between signals to be destroyed. As a result, signals transmitted across a clock domain crossing may be reconverged into an invalid state in the receiving clock domain due to signal delay introduced by metastability.

Figure 4:
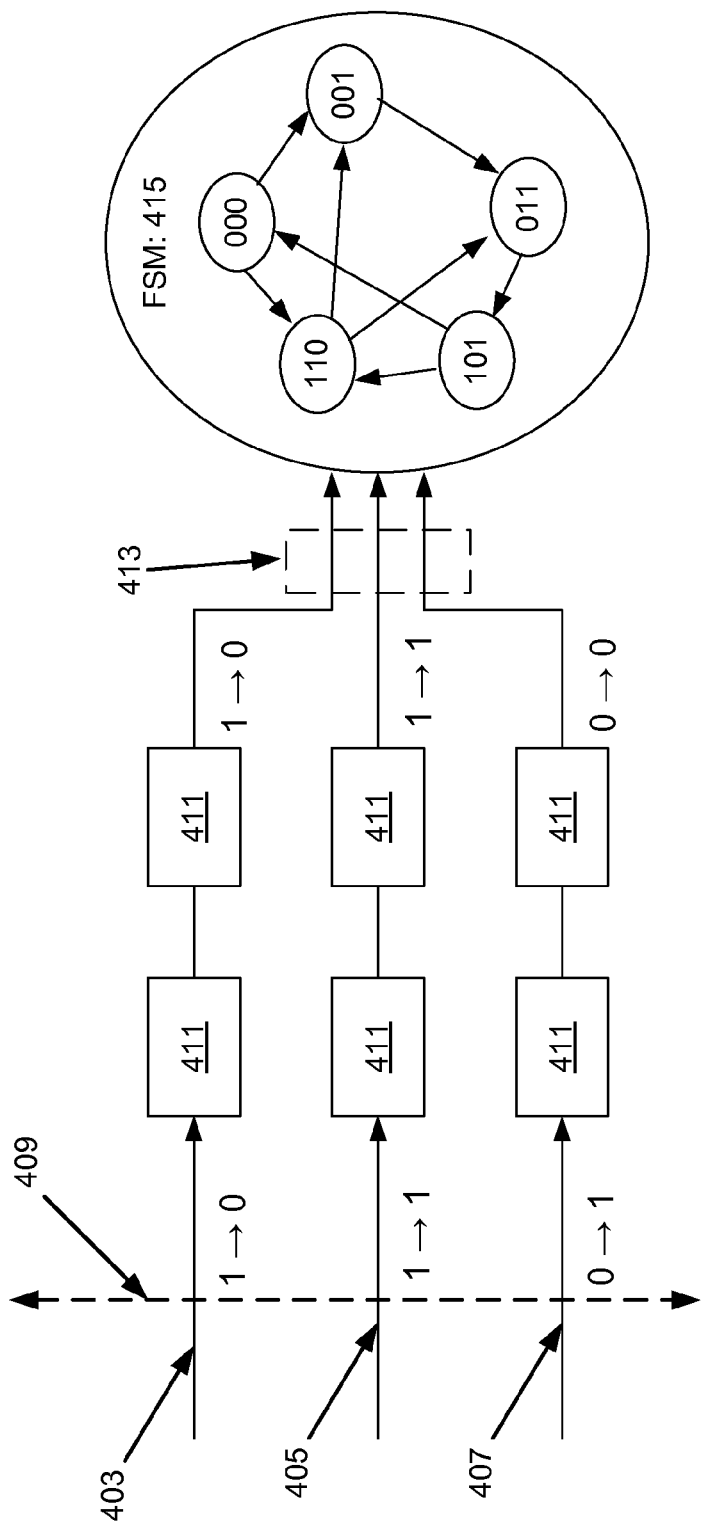
FIG. 4 illustrates the reconvergence of clock domain crossing signals.

FIG. 4 illustrates a reconvergence problem. As can be seen from this figure, signals 403-407 are transmitted across a clock domain crossing 409 and into synchronizers 411. After the signals 403-407 pass through the synchronizers 411, they are reconverged at point 413 and input into a finite state machine 415. As illustrated, the signal 403 is transmitted with a logical value of "1", which changes to a logical value of "0". The signal 405 is also transmitted with a logical value of "1", which does not change during the transaction. Furthermore, the signal 407 is transmitted with a logical value of "0", which changes to a logical value of "1". However, as a result of the random delay introduced by the synchronizers 411, the signal 407 is received with a logical value of "0" as opposed to a logical value of "1". Due to this error, the signals 403-407 are reconverged to form a signal with a logical value of "010". As can be seen from this figure, the logical value "010" is an illegal input to the finite state machine 415.

A second problem associated with reconvergence occurs where the transmitting clock is much faster than the receiving clock. A result of this misbalance is that the circuit on the receiving side of the clock domain crossing may miss some, part, or all of the transmitted signals. The effects of reconvergence can be mitigated by taking the following precautions. First, only one of the signals may be allowed to change for each clock cycle of the transmitting clock. Second, the transmitted signal needs to be stable enough for the receiving domain to sample. In various implementations of the invention, reconvergence may be verified by performing a gray code and signal stability verification. For example, with various implementations of the invention, reconvergence is verified by ensuring that Equation (1) and either Equation (3) or Equation (4) is satisfied.

Handshaking

Figure 5:
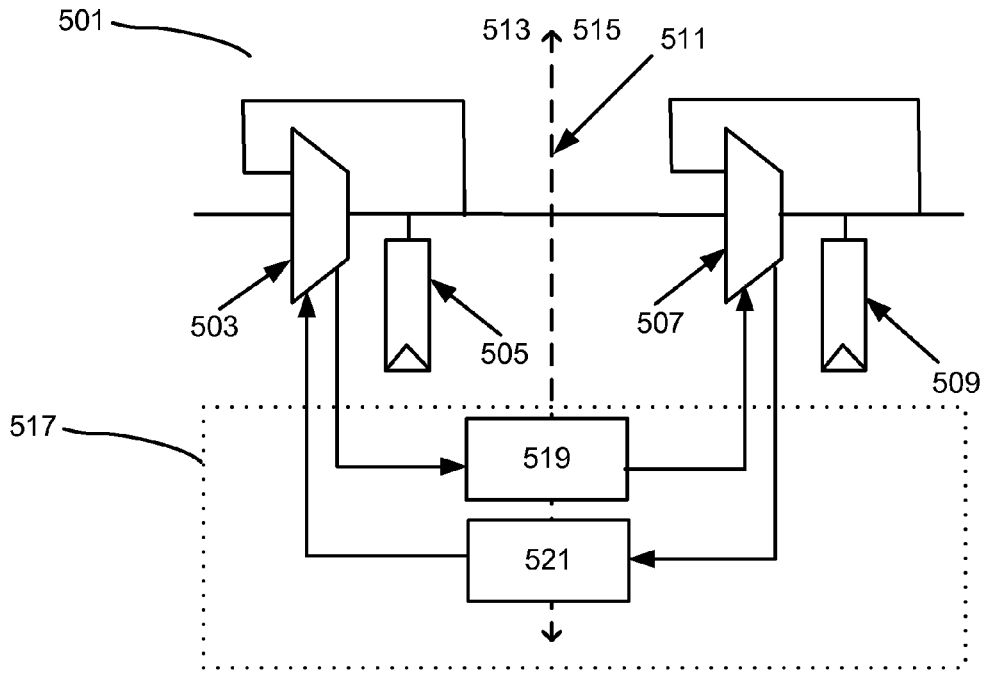
FIG. 5 illustrates a clock domain crossing handshaking scheme.

Handshaking is an effective method of transferring multiple bit signals, such as data, address, or control signals over a clock domain crossing. FIG. 5 illustrates a high level handshaking scheme 501. As can be seen in this figure, a transmitting component 503, having a first clock 505 is electrically connected to a receiving component 507, having a second clock 509. As the transmitting component 503 and the receiving component 507 have different clocks, a clock domain crossing boundary 511 is formed between them. The clock domain crossing boundary 511 separates a transmitting clock domain 513 and a receiving clock domain 515.

The handshaking scheme 501 operates by forming a sequential feedback loop 517 across the clock domain crossing boundary 511. The sequential feedback loop 517 includes a transmitting synchronizer 519 (request signal) and a receiving synchronizer 521 (acknowledge signal). The exchange of data between the transmitting clock domain 513 and the receiving clock domain 515 is facilitated by asserting various signals. For example, in the receiving clock domain 515 a data valid signal sourced from the transmitting clock domain 513 may control the receiving component 507. Conversely, in the transmitting clock domain 513, a data transfer acknowledgement signal from the receiving clock domain 515 may control the transmitting component 503.

In various implementations of the invention, a handshaking scheme such as the scheme 501 described above, may be verified by the ensuring the following:

a. Once a data valid signal is asserted, it remains asserted until a data transfer acknowledgement signal is asserted;

b. Once a data transfer acknowledgment signal is asserted it remains asserted until the data valid signal is de-asserted;

c. A second data valid signal is not asserted until the data transfer acknowledgement signal is de-asserted; and d. During the assertion of the data valid signal and the data transfer acknowledgement signal, the actual data remains stable.

First In First Out

Figure 6:
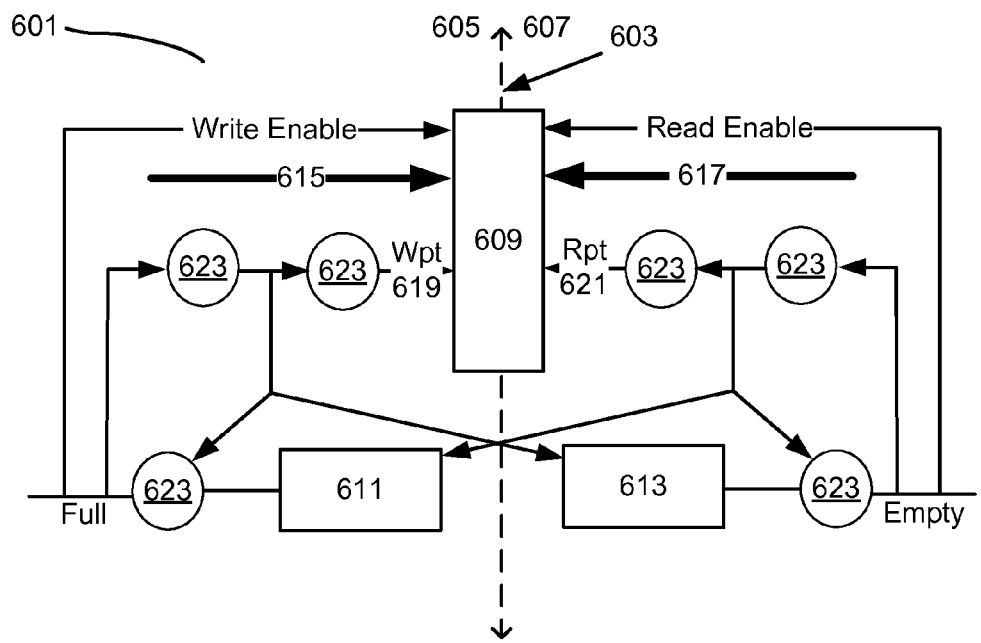
FIG. 6 illustrates a first in first out clock domain crossing scheme.

An additional method of transferring data between two clock domains is the first in first out (FIFO) method. FIG. 6 illustrates a first in first out scheme 601. As can be seen in this figure, the first in first out scheme 601 is formed across a clock domain crossing boundary 603, forming a transmitting clock domain 605 and a receiving clock domain 607. The first in first out scheme 601 utilizes a first in first out memory 609, a transmitting synchronizer 611, and a receiving synchronizer 613. The first in first out memory 609 is driven by both clocks from the transmitting clock domain 605 and the receiving clock domain 607.

The first in first out scheme 601 operates by allowing data to be written to the first in first out memory 609 through the signal lines 615 provided that a write enable signal is asserted by the transmitting synchronizer 611. Conversely data may be read from the first in first out memory 609 through the signal lines 617 provided that a read enable signal is asserted by the receiving synchronizer 613. Furthermore, the first in first out scheme 601 includes a write pointer 619 (Wpt) and a read pointer 621 (Rpt). The write pointer 619 and the read pointer 621 are synchronized into the transmitting clock domain 603 and the receiving clock domain 605 in order to generate an empty signal and a full signal. The generation of the various control signals, such as the write enable signal, is accomplished through various combination logics 623.

With various implementations of the invention, a first in first out scheme, such as the scheme 601 may be verified by ensuring that the following conditions are satisfied:

a. The write pointer 619 and the read pointer 621 are gray coded;

b. The first in first out memory 609 is not full when a write transaction occurs; and c. The first in first out memory 609 is not empty when a read transaction occurs.

Assertion Synthesis

As described above, verification of clock domain crossings generates a multitude of signals related to the corresponding clock domain crossing checks. These signals may be synthesized into logic components whose output is a signal indicating whether the clock domain crossing check failed or passed. Often these synthesized logic components are referred to as assertion logics. These assertion logics may be utilized by a verification procedure to determine whether the clock domain crossing behaves as intended. A benefit of synthesizing the assertions into assertion logics is that the clock domain crossing behavior may be synthesized into a device description, such as for example a netlist, which allows for verification of the clock domain crossing to take place alongside verification of the rest of the device.

In various implementations of the invention, synthesizing assertion logics is aided by splitting the clock domain crossing signals into sequences corresponding to the transmitting and receiving sides of the clock domain crossing. These split sequences are often referred to as left hand side (LHS) and right hand side (RHS) sequences. Splitting the signals into left hand side and right hand side sequences aids in the synthesis of the clock domain crossing itself. For example, the detection of a left hand side sequence may trigger the synthesis of a corresponding or "matching" right hand side sequence.

With respect to the right hand side sequences, the clock domain crossing checks are typically sequential checks. More particularly, the clock domain crossing checks compare signals in different timeframes. These clock domain crossing checks are often classified as either static timeframe checks or dynamic timeframe checks. A static time frame check is where the difference between the starting timeframe and the ending timeframe is a constant number. A dynamic timeframe check is where the difference between the starting timeframe and the ending timeframe is not a constant number. With various implementations of the present invention, dynamic timeframe checks and static timeframe checks are synthesized differently.

Synthesizing a Static-Timeframe Check

Figure 7:
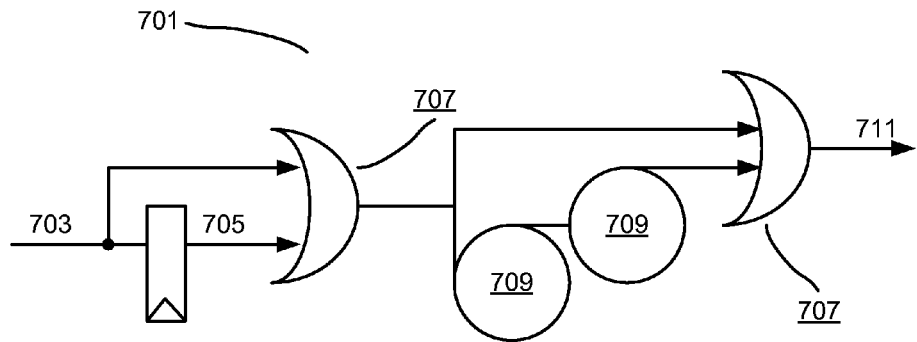
FIG. 7 illustrates a static gray code check for a clock domain crossing.

A static timeframe check may be synthesized by performing the above described clock domain crossing verifications, such as for example a gray code check, in a static timeframe. For example, FIG. 7 illustrates a gray code check 701 that may be performed on a clock domain crossing signal 703. As described above, a typical gray code forces the clock domain crossing signal to change at most one bit per clock cycle. As can be seen from FIG. 7, the clock domain crossing signal 703 and the clock domain crossing signal 703 at a subsequent time period, represented as the signal 705 are compared through an assertion logic component 707. Furthermore, delay registers 709 are shown. The delay registers 709 represent the delay between timeframes of the clock domain crossing signal 703 and the clock domain crossing signal 705. The output 711 of the assertion logic component 707 indicates if the gray code check 701 passed or failed.

Synthesizing a Dynamic-Time Frame Check

Dynamic timeframe checks may be synthesized by transforming a deterministic or non-deterministic automaton from one state to another. More particularly, let Q equal a finite automaton, such as for example $(\Sigma,S,I,T,F)$, where $\Sigma$ is the input alphabet, S is the set of states, I is the initial state, T equals $(S\times\Sigma)\times S$ and represents the relationship between transitions in the input alphabet, and F is the set of accepting states. Those of skill in the art can appreciate that various input alphabets $\Sigma$ are acceptable. For this example, let $\Sigma=2^A$, where A is a set of atomic propositions. Furthermore, those of skill in the art can appreciate that the language accepted by the automaton $\Omega$ is defined as the set of sequence over the alphabet $\Sigma$, which when provided as an input to $\Omega$ will result in an ending state selected from F. Typically, each input sequence is referred to as a word. A deterministic finite automaton (DFA) is a finite automaton, such as $\Omega$, wherein for each pair of state and input symbols there is one and only one transition to another state. A non-deterministic finite automaton (NFA) is a finite automaton, such as $\Omega$, wherein for each pair of state and input symbols there may be more than one transition to subsequent states.

Figure 8:
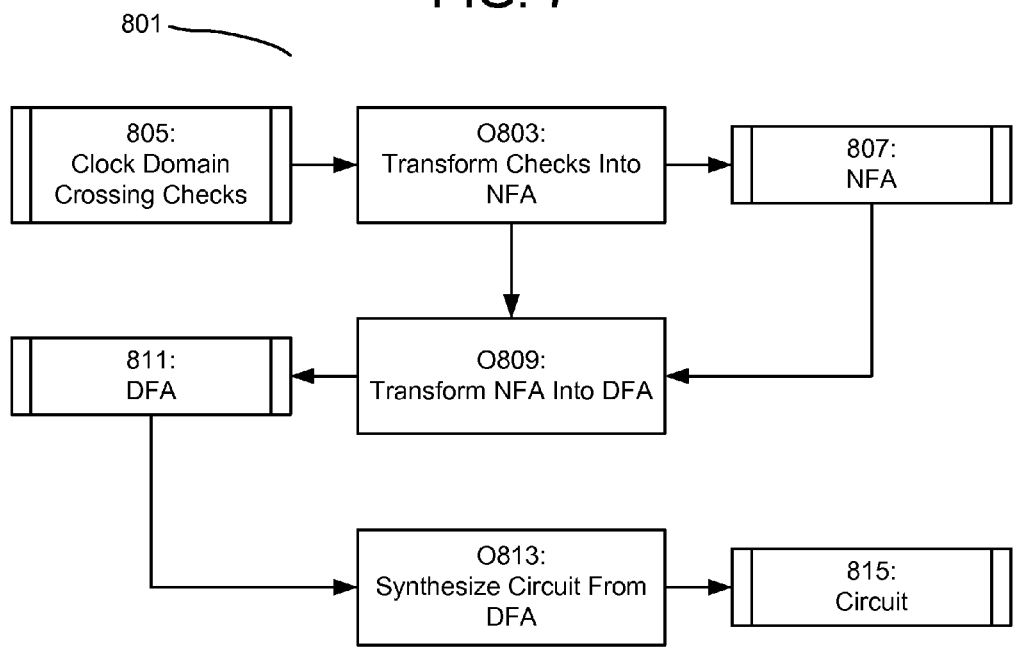
FIG. 8 illustrates a method for synthesizing a dynamic timeframe assertion corresponding to a clock domain crossing boundary.

With various implementations of the invention, a dynamic timeframe check may be synthesized according to the process 801 illustrated in FIG. 8. As can be seen from this figure, the process 801 includes an operation 803 for transforming a set of clock domain crossing checks 805 into a non-deterministic finite state machine 807. The process 801 further includes an operation 809 for transforming the non-deterministic finite state machine 807 into a deterministic finite state machine 811, and an operation 813 for synthesizing the deterministic finite state 811 into a circuit 815. The circuit 813 may be employed to verify a dynamic clock domain crossing, such as for example a handshaking check.

Figure 9:
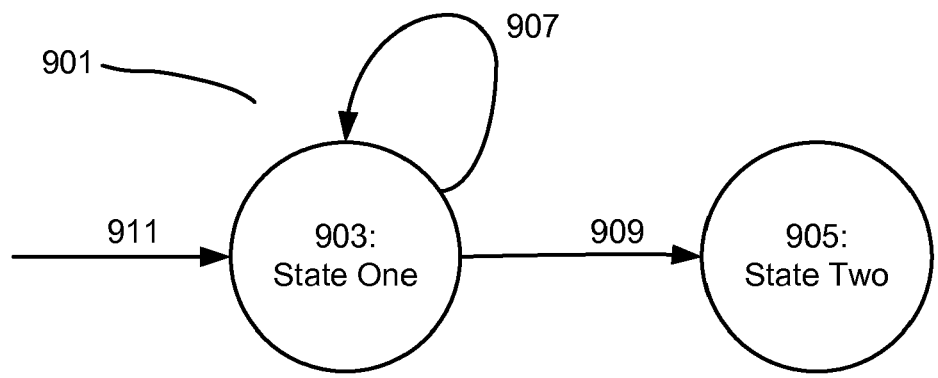
FIG. 9 illustrates a non-deterministic finite state machine corresponding to a handshaking scheme check.

As stated, a handshaking clock domain crossing check is a dynamic timeframe check. FIG. 9 illustrates a non-deterministic finite state machine 901 that describes the first check discussed above (i.e. ensuring that once a data valid signal is asserted it remains asserted until a data transfer acknowledgement signal is asserted). As can be seen from this figure, the non-deterministic finite state machine 901 includes a first state 903 and a second state 905. The first state represents the condition where the data valid signal is asserted and the second state represents the condition where the data transfer acknowledgment signal is asserted. Additionally, the non-deterministic finite state machine 901 includes a first transition 907 and a second transition 909. The first transition 907 represents the assertion of the data valid signal and the second transition 909 represents the assertion of the data transfer acknowledgement signal. Additionally, FIG. 9 illustrates a left hand side signal 911 (i.e. the transmitting clock domain data) entering the system.

Figure 10:
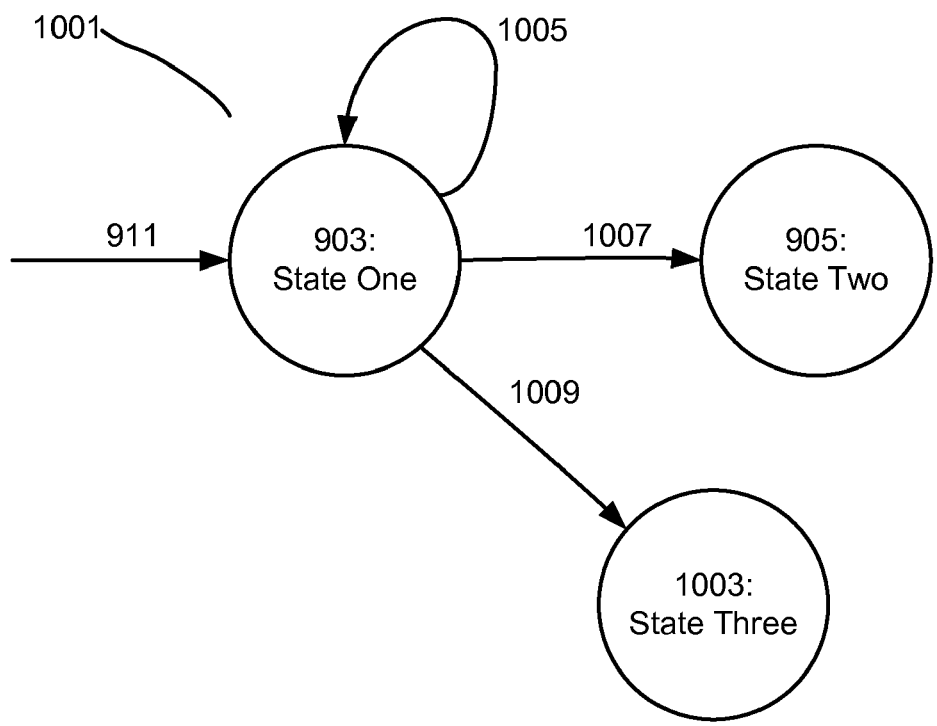
FIG. 10 illustrates a deterministic finite state machine corresponding to a handshaking scheme check.

As described above, a deterministic finite state machine may be generated that corresponds to a non-deterministic finite state machine. FIG. 10 illustrates a deterministic finite state machine 1001 that corresponds to the non-deterministic finite state machine 901 of FIG. 9. As can be seen from FIG. 10, the deterministic finite state machine 1001 includes the first state 903, the second state 905 and a third state 1003. Additionally, the transitions between states 1005, 1007 and 1009 are shown. The third state 1003 represents a failure of the clock domain crossing verification (i.e. the data valid signal not remain asserted until the data transfer acknowledgement signal was asserted). The transition 1005 represents the assertion of the data valid signal but not the assertion of the data transfer acknowledgment signal. The transition 1007 represents the assertion of the data transfer acknowledgment signal and the transition 1009 represents neither the data valid signal nor the data transfer acknowledgment signal being asserted. Those of skill in the art can appreciate that the deterministic finite state machine 1001 may be described by a behavioral model and synthesized into a circuit description, by for example describing the circuit in Verilog or VHDL. As detailed above, the circuit description of the dynamic clock domain crossing check may be employed in a formal verification process to ensure that data and signals are correctly transferred across clock domains in a device.

Formal Verification of Clock Domain Crossings

Figure 11:
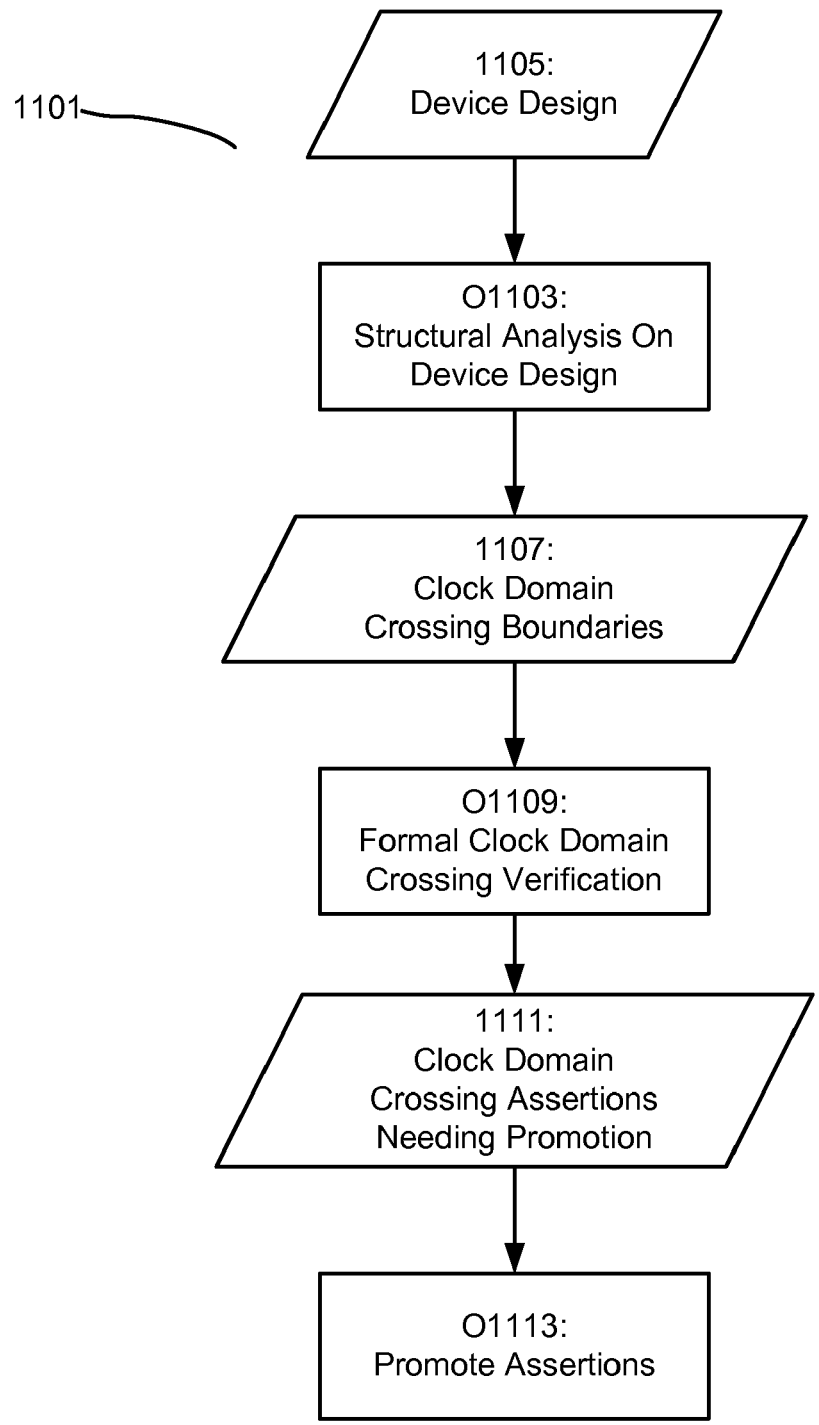
FIG. 11 illustrates a clock domain crossing verification method.

FIG. 11 illustrates a process 1101 that may be provided according to various implementations of the invention to formally verify a clock domain crossing. The process 1101 includes an operation 1103 for performing a structural analysis procedure on a device design 1105, resulting in the identification of clock domain crossing boundaries 1107 in the device design 1105. In various implementations of the invention, the device design 1105 is in the form of a netlist. With further implementations, the device design 1105 is in the form of a flattened netlist. The process 1101 further includes an operation 1109 for performing a formal verification procedure on the identified clock domain crossings 1107, wherein a set of clock domain crossing boundaries needing promotion 1111 is generated. More particularly, those clock domain crossing boundaries that need further verification, such as for example by post-formal verification clock domain crossing checks, are identified by the operation 1109. Additionally, the process 1101 may include an operation 1113 for promoting the set of clock domain crossing boundaries 1111 to a post-clock domain crossing boundary verification flow.

In various implementations of the invention, the clock domain crossing boundaries 1107 are placed into a queue, wherein the operation 1109 for performing formal verification on the clock domain crossings operates to verify the clock domain crossings on the fly. With various implementations, the verification takes place at the circuit level, such as for example by synthesizing the circuit as described above. With further implementations, the verification operates in an automated fashion to verify each clock domain crossing as it enters the queue.

Figure 12:
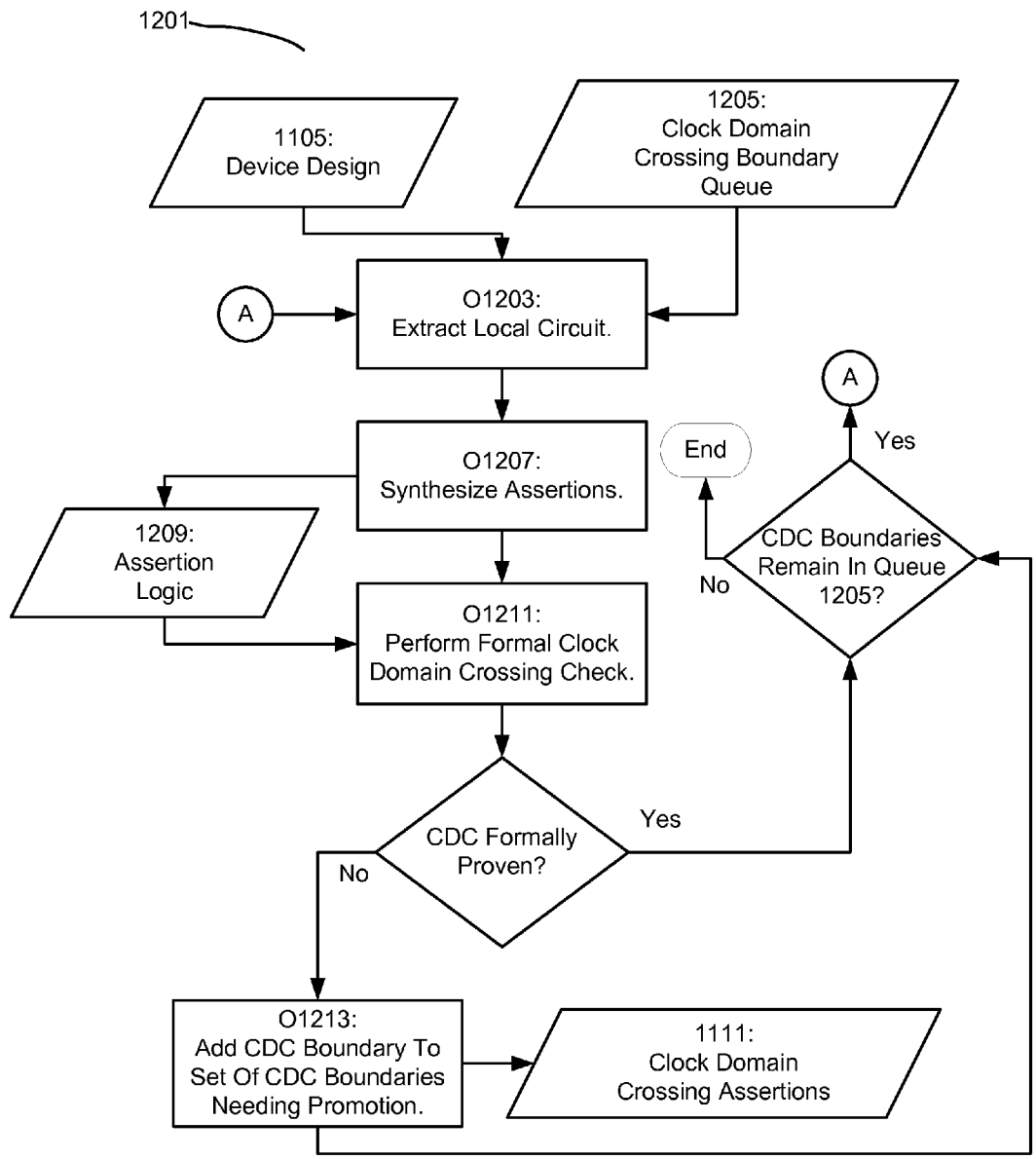
FIG. 12 illustrates a formal clock domain crossing verification method.

FIG. 12 illustrates a formal clock domain crossing verification procedure 1201 that may be provided according to various implementations of the present invention to perform the operation 1109 of FIG. 11. As can be seen form FIG. 12, the formal clock domain crossing verification procedure 1201 includes an operation 1203 for extracting a portion of the device design 1105 containing a clock domain crossing boundary identified in the clock domain crossing boundary queue 1205. In various implementations of the invention, the operation 1203 extracts a selected number of registers from the device design. With various implementations, a small number of registers, such as for example less than 4 are extracted. Still, with various implementations a larger number of registers, such as for example less than 10 are extracted. In still various implementations, less than 50 registers are extracted, and in still other implementations less than 100 registers may be extracted.

The formal clock domain crossing verification procedure 1201 further includes an operation 1207 for synthesizing the extracted local circuit into an assertion logic component 1209. In various implementations of the invention, the assertion logic component 1209 is in the form of a netlist. Subsequently, the procedure 1201 includes an operation 1211 for subjecting the assertion logic component 1209 to an appropriate clock domain crossing check. For example, if the assertion logic component 1209 implements a reconvergence scheme, a gray code clock domain crossing verification procedure may be performed by the operation 1211. In another example, if the assertion logic component 1209 implements a handshaking scheme, a handshaking verification procedure may be performed by the operation 1211. With a still further example, if the assertion logic 1209 implements a synchronizer, such as a proper bit synchronizer, an N-cycle stability verification procedure may be performed by the operation 1211. In a still further example, if the assertion logic 1209 implements a first in first out scheme, a first in first out formal verification procedure may be performed by the operation 1211.

In addition, the procedure 1201 includes an operation 1213 for adding the clock domain crossing boundary from the clock domain crossing boundary queue 1205 into the set of clock domain crossing boundaries needing promotion 1111. As can be seen from this figure, if the assertion logic component 1209 passes the clock domain crossing checks, the clock domain crossing synthesized into the assertion logic component 1209 is not included in the set of clock domain crossing boundaries needing promotion 1111. However, if the assertion logic component 1209 failed the clock domain crossing checks, (i.e. the operation 1211 indicates the assertion logic component 1209 failed the checks), the clock domain crossing boundary synthesized into the assertion logic component 1209 is included in the set of clock domain crossing boundaries needing promotion 1111.

As further detailed by FIG. 12, the procedure 1201, starting with the operation 1203, may be repeated for additional clock domain crossing boundaries in the queue 1205. In various implementations of the invention, clock domain crossing boundaries within the queue 1205 that are not processed by the procedure 1201 may be included in the set of clock domain crossing boundaries 1111. More particularly, for those clock domain crossing boundaries within the queue 1205 that were not synthesized by the operation 1207 and verified by the operation 1211 may be included in the set of clock domain crossing boundaries 1111.

CONCLUSION

As detailed above, various implementations of the invention provide methods and apparatuses for performing automated formal clock domain crossing verification on a device. With various implementations, a device may be analyzed, wherein the clock domain crossing boundaries are identified. Subsequently, a formal clock domain crossing verification method may be applied to the identified clock domain crossing boundaries, resulting in clock domain crossing assertions being identified. After which the identified assertions may be promoted for post clock domain crossing analysis. With various implementations of the invention, a formal clock domain crossing method is provided, wherein the device components near an identified clock domain crossing are extracted. Assertions may then be synthesized and verified based upon the extracted components.

Various implementations of the invention provide for clock domain crossing verification to be performed iteratively, wherein a larger and larger selection of the device is extracted during formal verification. Additionally, various implementations of the present invention provide that the clock domain crossing verification operate on the fly during a device verification procedure. With further implementations, a bit-blasted approach to clock domain crossing verification may be provided during formal verification.

Although certain devices and methods have been described above in terms of the illustrative embodiments, the person of ordinary skill in the art will recognize that other embodiments, examples, substitutions, modifications and alterations are possible. It is intended that the invention cover such other embodiments, examples, substitutions, modifications and alterations within the spirit and scope of the claims.

What is claimed is:

1. A computer implemented method for performing verification of a device design comprising:
   identifying a plurality of clock domain crossing boundaries within a device design;
   performing on a computer a formal clock domain crossing verification process on ones of the plurality of clock domain crossing boundaries, the formal clock domain crossing verification process generating a set of clock domain crossing boundaries to be promoted; and
   saving the set of clock domain crossing boundaries to a memory storage location.

2. The computer implemented method recited in claim 1, wherein the method act of identifying a plurality of clock domain crossing boundaries within the device design comprises:
   performing a structural analysis process on the device design, wherein the plurality of clock domain crossing boundaries are identified; and
   placing the identified clock domain crossing boundaries into a verification queue.

3. The computer implemented method recited in claim 1, wherein the formal clock domain crossing verification process comprises:
   selecting a clock domain crossing boundary from the verification queue;
   extracting a portion of the device design, the extracted portion of the device design containing the selected clock domain crossing boundary;
   synthesizing a clock domain crossing assertion based at least in part on the selected clock domain crossing boundary and the extracted portion of the device design;
   applying a clock domain crossing protocol check on the synthesized clock domain crossing assertion, the clock domain crossing protocol check producing an outcome; and
   determining if the selected clock domain crossing boundary should be included in the set of clock domain crossing boundaries to be promoted based on the outcome.

4. The computer implemented method recited in claim 3, wherein the clock domain crossing protocol check is comprised of a first clock domain crossing protocol check and a second clock domain crossing protocol check.

5. The computer implemented method recited in claim 4, wherein the first clock domain crossing protocol check is different that the second clock domain crossing protocol check.

6. The computer implemented method recited in claim 3, wherein the clock domain crossing protocol check is a gray code check, or a first in first out check, or a handshaking check, or an N-cycle stability check.

7. The computer implemented method recited in claim 3, further comprising performing a post-clock crossing verification process on the set of clock domain crossing boundaries to be promoted.

8. The computer implemented method recited in claim 1, the device design being represented as a netlist.

9. The computer implemented method recited in claim 8, the netlist being a flattened netlist.

10. A computer program product for enabling a computer to verify a device design comprising:
    software instructions for enabling a computer to perform a set of predetermined operations; and
    a computer readable storage medium non-transitorily storing the software instructions;
    the set of predetermined operations including:
      identifying a device design;
      identifying a plurality of clock domain crossing boundaries within the device design;
      performing a formal clock domain crossing verification process on ones of the plurality of clock domain crossing boundaries, the formal clock domain crossing verification process generating a set of clock domain crossing boundaries to be promoted; and
      saving the set of clock domain crossing boundaries to a memory storage location.

11. The computer program product recited in claim 10, wherein the predetermined operation of identifying a plurality of clock domain crossing boundaries within the device design comprising:
    performing a structural analysis process on the device design, wherein the plurality of clock domain crossing boundaries are identified; and
    placing the identified clock domain crossing boundaries into a verification queue.

12. The computer program product recited in claim 10, wherein the formal clock domain crossing verification process comprising:
    selecting a clock domain crossing boundary from the verification queue;
    extracting a portion of the device design, the extracted portion of the device design containing the selected clock domain crossing boundary;
    synthesizing a clock domain crossing assertion based at least in part on the selected clock domain crossing boundary and the extracted portion of the device design;
    applying a clock domain crossing protocol check on the synthesized clock domain crossing assertion, the clock domain crossing protocol check producing an outcome; and
    determining if the selected clock domain crossing boundary should be included in the set of clock domain crossing boundaries to be promoted based on the outcome.

13. The computer program product recited in claim 12, wherein the clock domain crossing protocol check is comprised of a first clock domain crossing protocol check and a second clock domain crossing protocol check.

14. The computer program product recited in claim 13, wherein the first clock domain crossing protocol check is different that the second clock domain crossing protocol check.

15. The computer program product recited in claim 12, wherein the clock domain crossing protocol check is a gray code check, or a first in first out check, or a handshaking check, or an N-cycle stability check.

16. The computer program product recited in claim 12, further comprising performing a post-clock crossing verification process on the set of clock domain crossing boundaries to be promoted.

17. The computer program product recited in claim 10, the device design being represented as a netlist.

18. The computer program product recited in claim 17, the netlist being a flattened netlist.

19. A computer system adapted to performing verification of a device design comprising:
a computer system including a processor and a memory, the memory containing software instructions that cause the computer system to perform a set of operations comprising:
identifying a device design;
identifying a plurality of clock domain crossing boundaries within the device design;
performing a formal clock domain crossing verification process on ones of the plurality of clock domain crossing boundaries, the formal clock domain crossing verification process generating a set of clock domain crossing boundaries to be promoted; and
saving the set of clock domain crossing boundaries to a memory storage location.

* * * * *